(12) United States Patent
Chen et al.

(10) Patent No.: US 12,094,956 B2
(45) Date of Patent: *Sep. 17, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chin-Hung Chen, Tainan (TW); Ssu-I Fu, Kaohsiung (TW); Chih-Kai Hsu, Tainan (TW); Chia-Jung Hsu, Tainan (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/206,097

(22) Filed: Jun. 6, 2023

(65) Prior Publication Data
US 2023/0327003 A1    Oct. 12, 2023

Related U.S. Application Data

(60) Continuation of application No. 17/197,056, filed on Mar. 10, 2021, now Pat. No. 11,710,778, which is a
(Continued)

(30) Foreign Application Priority Data

Mar. 11, 2019 (CN) .......................... 201910180883.1

(51) Int. Cl.
*H01L 29/66* (2006.01)
*H01L 21/033* (2006.01)
(Continued)

(52) U.S. Cl.
CPC .... *H01L 29/66795* (2013.01); *H01L 21/0337* (2013.01); *H01L 21/3086* (2013.01);
(Continued)

(58) Field of Classification Search
CPC ........... H01L 29/7856; H01L 29/66795; H01L 21/3086
See application file for complete search history.

(56) References Cited

U.S. PATENT DOCUMENTS 6,391,782 B1    5/2002 Yu
8,987,836 B2    3/2015 Kim
(Continued)

FOREIGN PATENT DOCUMENTS

CN    101350295 A    1/2009
CN    103107192 A    5/2013
(Continued)

OTHER PUBLICATIONS

Jin et al., One dimensional inorganic nano materials, Metallurgical Industry Publishing Company, Beijing, p. 199-200, Jun. 30, 2007.
(Continued)

*Primary Examiner* — Jose R Diaz
(74) *Attorney, Agent, or Firm* — Winston Hsu

(57) ABSTRACT

A method for fabricating semiconductor device includes: forming a first semiconductor layer and an insulating layer on a substrate; removing the insulating layer and the first semiconductor layer to form openings; forming a second semiconductor layer in the openings; and patterning the second semiconductor layer, the insulating layer, and the first semiconductor layer to form fin-shaped structures.

8 Claims, 5 Drawing Sheets

Related U.S. Application Data division of application No. 16/378,584, filed on Apr. 9, 2019, now Pat. No. 10,985,264.

(51) Int. Cl.

| | |
|---|---|
| *H01L 21/308* | (2006.01) |
| *H01L 21/8234* | (2006.01) |
| *H01L 21/8238* | (2006.01) |
| *H01L 21/84* | (2006.01) |
| *H01L 27/06* | (2006.01) |
| *H01L 27/088* | (2006.01) |
| *H01L 27/12* | (2006.01) |
| *H01L 29/78* | (2006.01) |

(52) U.S. Cl.
CPC .... *H01L 21/823431* (2013.01); *H01L 21/845* (2013.01); *H01L 27/0605* (2013.01); *H01L 27/0886* (2013.01); *H01L 29/6681* (2013.01); *H01L 29/7851* (2013.01); *H01L 29/7856* (2013.01); *H01L 21/823821* (2013.01); *H01L 27/1211* (2013.01); *H01L 2924/1033* (2013.01); *H01L 2924/10344* (2013.01)

(56) References Cited

U.S. PATENT DOCUMENTS

| | | | |
|---|---|---|---|
| 9,171,843 B2 | 10/2015 | Ching | |
| 9,287,135 B1 | 3/2016 | Doris | |
| 9,472,407 B2 | 10/2016 | Jagannathan | |
| 9,680,017 B2 | 6/2017 | Lo | |
| 9,704,737 B2 | 7/2017 | Feng | |
| 10,475,935 B2 | 11/2019 | Zhu | |
| 10,546,926 B2 | 1/2020 | Cheng | |
| 10,903,108 B2 | 1/2021 | Jang | |
| 10,985,264 B2 | 4/2021 | Chen | |
| 11,152,515 B2 | 10/2021 | Chen | |
| 11,152,516 B2 | 10/2021 | Zhu | |
| 11,710,778 B2 * | 7/2023 | Chen | H01L 29/7851 257/76 |
| 2009/0008695 A1 | 1/2009 | Chen | |
| 2015/0147874 A1 | 5/2015 | Huang | |
| 2016/0064224 A1 | 3/2016 | Hung | |
| 2018/0315753 A1 | 11/2018 | Balakrishnan | |
| 2019/0341452 A1 | 11/2019 | Miao | |
| 2021/0305100 A1 | 9/2021 | Yu | |

FOREIGN PATENT DOCUMENTS

| | | |
|---|---|---|
| CN | 105633166 A | 6/2016 |
| CN | 106486371 A | 3/2017 |
| CN | 106847813 A | 6/2017 |
| CN | 103748687 B | 8/2017 |

OTHER PUBLICATIONS

Hashizume, Title: Suppression of current collapse in insulated gate AlGaN/GaN heterostructure field-effect transistors using ultrathin Al2O3 dielectric; Applied Physics Letters, 83(14):2952-2954, Oct. 6, 2003.

* cited by examiner

SEMICONDUCTOR DEVICE AND METHOD FOR FABRICATING THE SAME

CROSS REFERENCE TO RELATED APPLICATIONS

This application is a continuation application of U.S. application Ser. No. 17/197,056, filed on Mar. 10, 2021, which is a division of U.S. application Ser. No. 16/378,584, filed on Apr. 9, 2019. The contents of these applications are incorporated herein by reference.

BACKGROUND OF THE INVENTION

1. Field of the Invention

The invention relates to a method for fabricating semiconductor device, and more particularly, to a method of using sidewall image transfer (SIT) technique to form fin-shaped structures.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (Fin FET) have three-dimensional structure, not only capable of increasing the contact to the gate but also improving the controlling of the channel region, such that the non-planar FETs have replaced the planar FETs and become the mainstream of the development.

The current method of forming the Fin FETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the Fin FETs also faces more challenges and limitations. For example, the fabricating process is limited by current mask and lithography techniques, such that it has problems to precisely define the position of the fin structure, or to precisely control the etching time, thereby leading to the fin collapse or over-etching issues, and seriously affecting the efficiency of the fin structure.

SUMMARY OF THE INVENTION

According to an embodiment of the present invention, a method for fabricating semiconductor device includes: forming a first semiconductor layer and an insulating layer on a substrate; removing the insulating layer and the first semiconductor layer to form openings; forming a second semiconductor layer in the openings; and patterning the second semiconductor layer, the insulating layer, and the first semiconductor layer to form fin-shaped structures.

According to another aspect of the present invention, a semiconductor device includes a fin-shaped structure on a substrate, wherein the fin-shaped structure further includes a first semiconductor layer on the substrate, a second semiconductor layer on the first semiconductor layer, an insulating layer on the second semiconductor layer, and a third semiconductor layer on the insulating layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
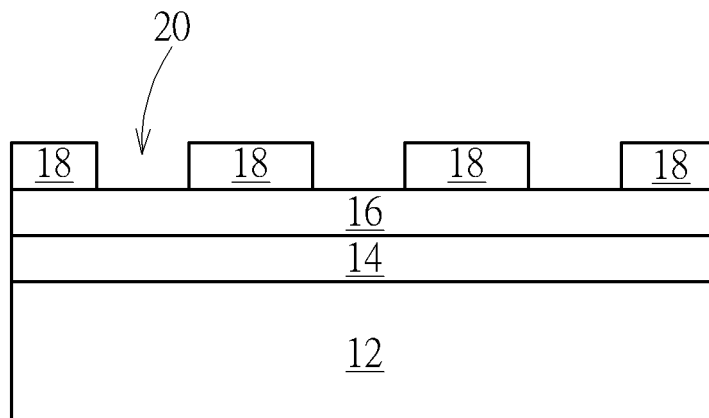
FIGS. 1-10 illustrate a method for fabricating a semiconductor device according to an embodiment of the present invention.

Referring to FIGS. 1-10, FIGS. 1-10 illustrate a method for fabricating a semiconductor device according to an embodiment of the present invention. As shown in FIG. 1, a substrate 12 such as a semiconductor substrate is provided, in which the substrate 12 is preferably made of a group III-V semiconductor material or more specifically made of bulk gallium nitride (GaN). Next, a semiconductor layer 14 and an insulating layer 16 are sequentially formed on the surface of the substrate 12, and a patterned mask 18 such as a patterned resist is formed on the insulating layer 16, in which the patterned mask 18 includes a plurality of openings 20 exposing the surface of the insulating layer 16. In this embodiment, the semiconductor layer 14 is preferably made of a group III-V semiconductor material while the semiconductor layer 14 and the substrate 12 are preferably made of different materials. Preferably, the semiconductor layer 14 is made of metal oxide including but not limited to for example aluminum gallium nitride (AlGaN) and the insulating layer 16 is made of metal oxides including but not limited to for example aluminum oxide ($Al_2O_3$).

Figure 2:
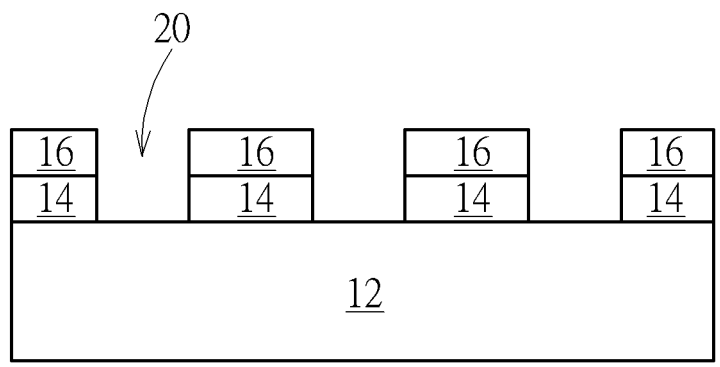

Next, as shown in FIGS. 1-2, an etching process is conducted by using the patterned mask 18 as mask to remove part of the insulating layer 16 and part of the semiconductor layer 14 to expose part of the substrate 12 surface for forming a patterned insulating layer 16 and a patterned semiconductor layer 14 on the substrate 12. It should be noted that even though the etching process conducted at this stage preferably does not remove any of the substrate 12 so that the top surface of the substrate 12 is even with the bottom of the semiconductor layer 14, according to another embodiment of the present invention, it would also be desirable to remove part of the insulating layer 16 and part of the semiconductor layer 14 and then remove part of the substrate 12 so that the top surface of the remaining substrate 12 is slightly lower than the bottom of the semiconductor layer 14, which is also within the scope of the present invention. Next, the patterned mask 18 is stripped to expose the top of the patterned insulating layer 16 and openings from the patterned mask 18 are then transferred to form openings 20 in the patterned insulating layer 16 and patterned semiconductor layer 14.

Figure 3:
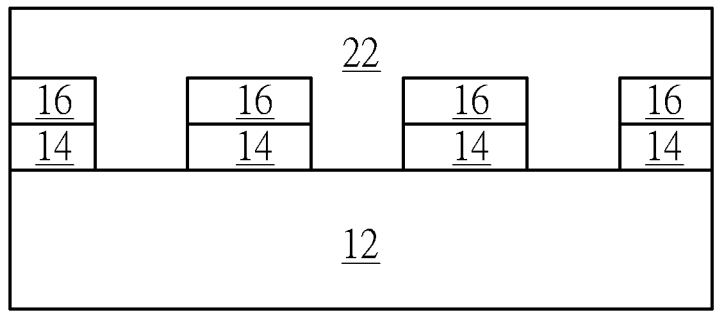

Next, as shown in FIG. 3, a growth process is conducted to form another semiconductor layer 22 to fill the openings 20 while extending upward to cover the top surface of the insulating layer 16. It should be noted that since the top surface of the semiconductor layer 22 is non-planar immediately after the growth process, it would be desirable to conduct a planarizing process such as chemical mechanical polishing (CMP) process to remove part of the semiconductor layer 22 so that the top surface of the remaining semiconductor layer 22 becomes a planar surface. In this embodiment, the semiconductor layer 22 is preferably made of group III-V semiconductor material while the semiconductor layers 22 and 14 are preferably made of different materials but semiconductor layer 22 and the substrate 12 are made of same material. For instance, the substrate 12 and the semiconductor layer 22 are preferably made of GaN.

Figure 4:
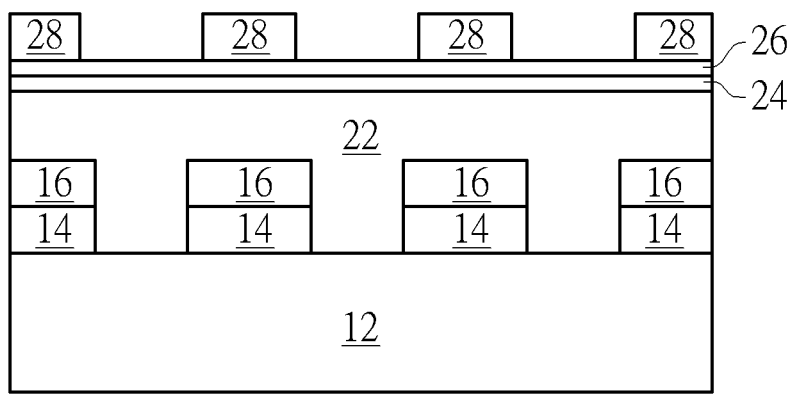

Next, as shown in FIG. 4, a hard mask 24 and another hard mask 26 are sequentially formed on the surface of the semiconductor layer 22, and a plurality of mandrels 28 are formed on the hard mask 26. In this embodiment, the hard masks 24, 26 are preferably made of different materials while the two masks 24, 26 could all be selected from the group consisting of silicon oxide (SiO$_2$), silicon nitride (SiN), silicon oxynitride (SiON), and silicon carbon nitride (SiCN). The formation of the mandrels 28 could be accomplished by forming at least a material layer (not shown) to cover the entire surface of the hard mask 26, and a pattern transfer process is conducted by using etching process to remove part of the material layer to form a plurality of patterned materials serving as mandrels 28. Preferably, the mandrels 28 could include materials such as but not limited to for example amorphous silicon, polysilicon, SiO$_2$, or SiN. Preferably, each of the mandrels 28 share equal widths in this embodiment and the distance of pitch between the mandrels 28 are preferably the same.

Figure 5:
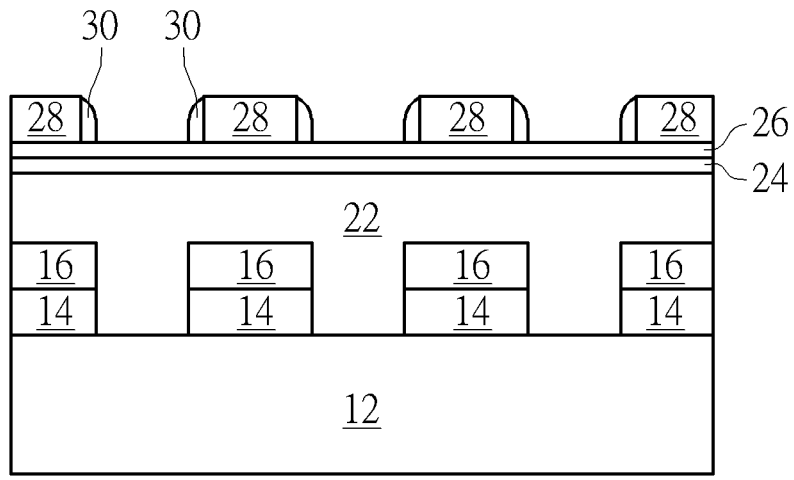

Next, as shown in FIG. 5, a cap layer (not shown) is formed to cover the surfaces of the mandrels 28 and the hard mask 26, and an etching back process is conducted to remove part of the cap layer to form spacers 30 adjacent to each of the mandrels 28. In this embodiment, the spacers 30 could include dielectric materials such as but not limited to for example silicon oxide (SiO$_2$), silicon nitride (SiN), silicon oxynitride (SiON), and/or silicon carbon nitride (SiCN). It should be noted that since the sidewalls of the semiconductor layer 22 need to be aligned with sidewalls of the insulating layer 16 and semiconductor layer 14 underneath when patterning process is conducted to form fin-shaped structures in the later process, a combined width of a mandrel 28 and adjacent spacer 30 is preferably equal to a width of the patterned insulating layer 16 and/or patterned semiconductor layer 14 underneath. In other words, the sidewalls of the spacer 30 adjacent to two sides of each of the mandrels 28 are aligned with left and right sidewalls of the insulating layer 16 and semiconductor layer 14 underneath.

Figure 6:
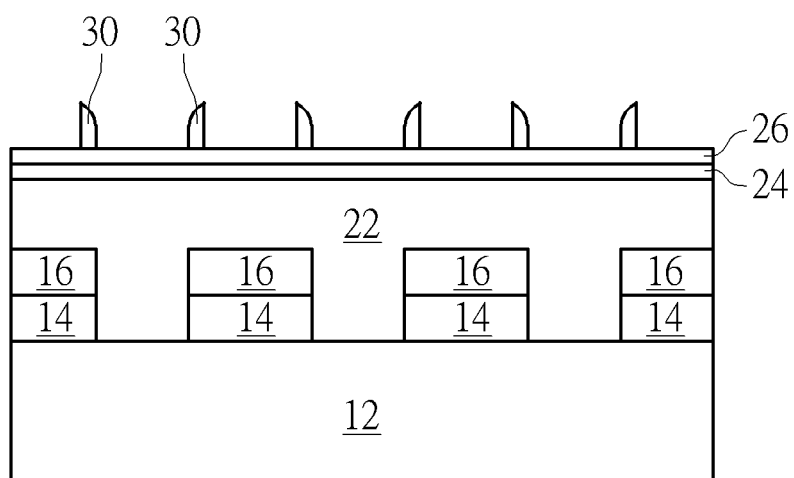

Next, as shown in FIG. 6, an etching process is conducted to remove the mandrels 28 so that only spacers 30 are remained on the hard mask 26.

Figure 7:
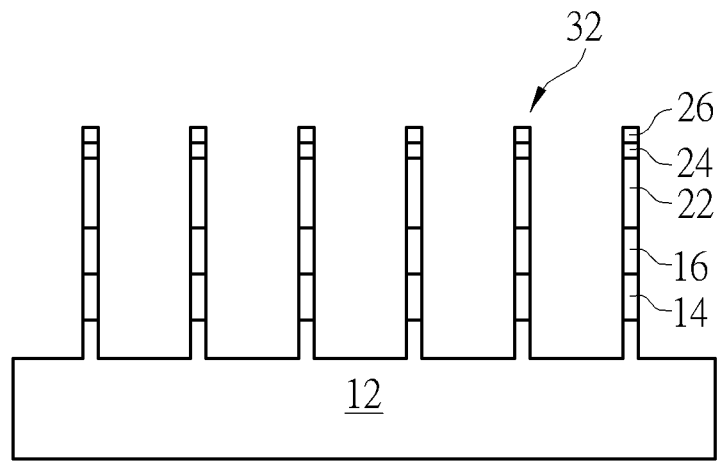

Next, as shown in FIG. 7, the pattern of the spacers 30 is then transfer to the stacked materials underneath. For instance, it would be desirable to conduct an etching process by using the spacers 30 as mask to remove the hard mask 26, the hard mask 24, the semiconductor layer 22, the insulating layer 16, the semiconductor layer 14, and even part of the substrate 12 not covered by the spacers 30 to form fin-shaped structures 32, and the spacers 30 are removed thereafter. It should be noted that the fin-shaped structures 32 formed at this stage if viewed from a top view perspective are preferably ring-shaped structures on the substrate 12.

Figure 8:
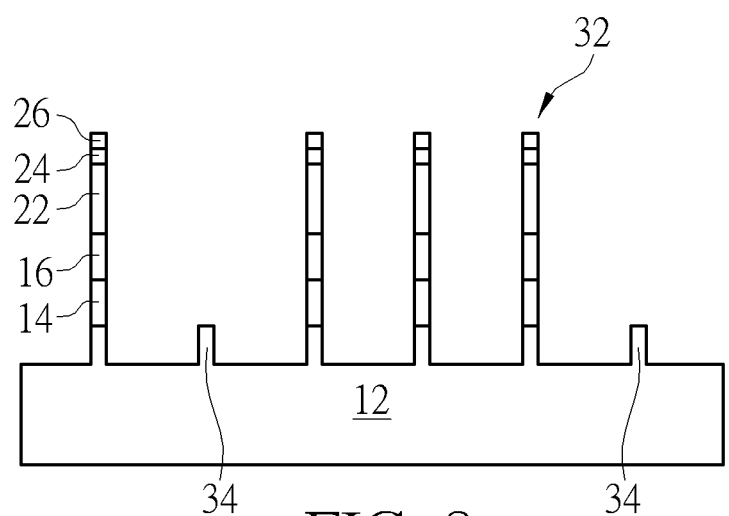

Next, as shown in FIG. 8, a fin cut process is conducted by using a patterned mask (not shown) to divide the ring-shape fin-shaped structures 32 into stripe patterns not contacting each other through etching process. Since the fin cut process cannot remove part of the fin-shaped structures 32 on the substrate 12 completely, part of the remaining fin-shaped structures or bumps 34 could be formed on the substrate 12 after the fin cut process.

Figure 9:
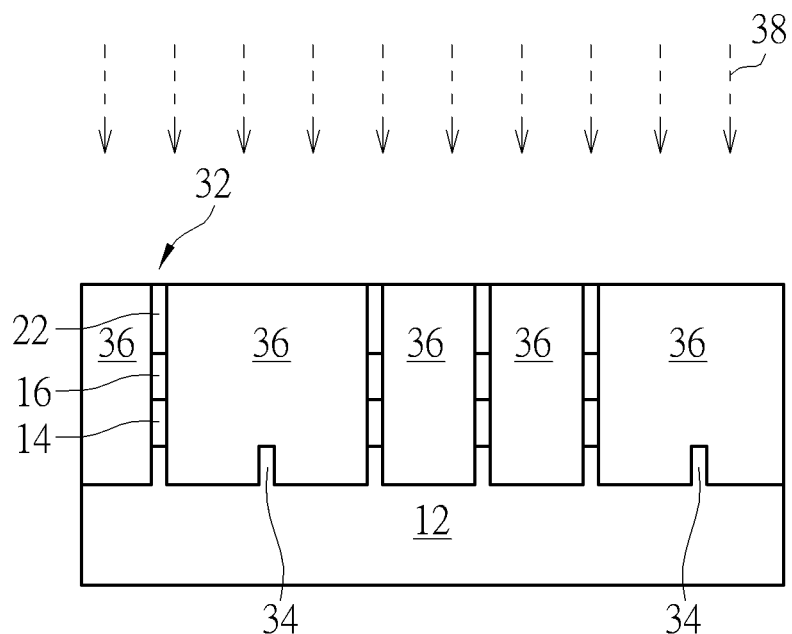

Next, as shown in FIG. 9, an insulating layer 36 preferably made of silicon oxide is formed on the fin-shaped structures 32 to cover the substrate 12, bumps 34, and fin-shaped structures 32 entirely and a top surface of the insulating layer 36 is higher than the top surface of the fin-shaped structures 32, and a planarizing process such as chemical mechanical polishing (CMP) process is conducted to remove part of the insulating layer 36, hard mask 26, and hard mask 24 so that the top surface of the remaining insulating layer 36 is substantially even with the top surface of the semiconductor layer 22. Next, an ion implantation process 38 is conducted to implant n-type or p-type dopants into the semiconductor layer 22 to form well regions.

Figure 10:
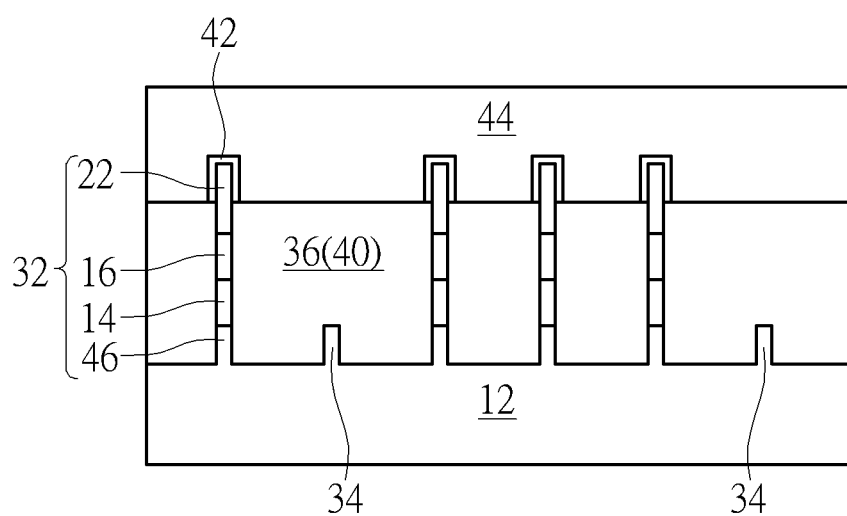

Next, as shown in FIG. 10, another etching process is conducted to remove part of the insulating layer 36 so that the top surface of the remaining insulating layer 36 is between the top surface and bottom surface of the semiconductor layer 22 as the tip of the semiconductor layer 22 of each of the fin-shaped structures 32 is exposed, in which the remaining insulating layer 36 preferably serving as a shallow trench isolation (STI) 40 while the exposed semiconductor layer 22 becomes channel regions for the transistors afterwards. Next, a standard transistor fabrication process could be conducted by forming a gate dielectric layer 42 and a gate material layer or gate electrode 44 made of polysilicon on the fin-shaped structures 32, forming spacers adjacent to the sidewalls of the gate electrode 44, and then forming source/drain regions in the fin-shaped structures 32 adjacent to two sides of the gate electrode 44. This completes the fabrication of a semiconductor device according to an embodiment of the present invention.

Referring again to FIG. 10, FIG. 10 also illustrates a structural view of a semiconductor device according to an embodiment of the present invention. As shown in FIG. 10, the semiconductor device includes a plurality of fin-shaped structures 32 disposed on the substrate 12, in which each of the fin-shaped structures 32 further includes a semiconductor layer 46 on the substrate 12, a semiconductor layer 14 on the semiconductor layer 46, an insulating layer 16 on the semiconductor layer 14, and a semiconductor layer 22 on the insulating layer 16. The semiconductor device further includes a STI 40 disposed around the fin-shaped structures 32, a gate dielectric layer 42 disposed on the surface of the semiconductor layer 22, and a gate electrode 44 or gate structure disposed on the gate dielectric layer 42. In this embodiment, the left and right sidewalls of the semiconductor layer 46 are aligned with left and right sidewalls of the semiconductor layer 14, the left and right sidewalls of the insulating layer 16, and the left and right sidewalls of the semiconductor layer 22, the top surface of the STI 40 is preferably between the top and bottom surfaces of the semiconductor layer 22, and the STI 40 surrounds the semiconductor layer 46, the semiconductor layer 14, the insulating layer 16, and part of the semiconductor layer 22.

In this embodiment, the semiconductor layer 46 protruding above the surface of the substrate 12, the semiconductor layer 22 serving as the channel region for the transistor device, and the substrate 12 are preferably made of same material such as a group III-V semiconductor material. Preferably, the substrate 12, the semiconductor layer 46, and the semiconductor layer 22 are made of GaN in this embodiment, in which the topmost semiconductor layer 22 serving as the channel region could include p-type or n-type dopants while the semiconductor layer 46 and the substrate 12 preferably not including any dopants. The semiconductor layer 14 is preferably made of a group III-V semiconductor layer different from the semiconductor layers 22, 46. Preferably, the semiconductor layer 14 is made of AlGaN in this embodiment and the insulating layer 16 between the semiconductor layers 14, 22 is preferably made of $Al_2O_3$.

Overall, the present invention discloses an approach of using group III-V semiconductor material as a main material for fabricating fin-shaped structures. The fabrication of the fin-shaped structures is accomplished by first forming a first semiconductor layer made of AlGaN and an insulating layer made of $Al_2O_3$ on the substrate, conducting a pattern transfer process to remove part of the insulating layer and part of the first semiconductor layer to form a plurality of openings, forming a semiconductor layer made of GaN in the openings, and then conducting a sidewall image transfer (SIT) process with the aid of mandrels and spacers to pattern the second semiconductor, the insulating layer, and the first semiconductor layer for forming a plurality of fin-shaped structures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a first semiconductor layer and an insulating layer on a substrate;
    removing the insulating layer and the first semiconductor layer to form openings;
    forming a second semiconductor layer in the openings and on and directly contacting the insulating layer, wherein the substrate and the second semiconductor layer comprise a same material and the first semiconductor layer and the second semiconductor layer comprise different materials; and
    patterning the second semiconductor layer, the insulating layer, and the first semiconductor layer by etching the second semiconductor layer, the insulating layer, and the first semiconductor layer at the same time to form fin-shaped structures.

2. The method of claim 1, further comprising:
    removing the insulating layer and the first semiconductor layer to form a patterned insulating layer and a patterned first semiconductor layer and the openings;
    forming the second semiconductor layer in the openings and on the patterned insulating layer;
    planarizing the second semiconductor layer;
    forming a mandrel on the second semiconductor layer;
    forming a spacer adjacent to the mandrel;
    removing the mandrel; and
    using the spacer to pattern the second semiconductor layer, the insulating layer, the first semiconductor layer, and the substrate to form the fin-shaped structures.

3. The method of claim 2, further comprising:
    forming a first hard mask and a second hard mask on the second semiconductor layer;
    forming the mandrel on the second hard mask; and
    using the spacer to pattern the second hard mask, the first hard mask, the second semiconductor layer, the insulating layer, the first semiconductor layer, and the substrate to form the fin-shaped structures.

4. The method of claim 2, wherein a combined width of the mandrel and the spacer is equal to a width of the patterned insulating layer.

5. The method of claim 1, wherein the substrate and the second semiconductor layer comprises gallium nitride (GaN).

6. The method of claim 1, wherein the first semiconductor layer comprises aluminum gallium nitride (AlGaN).

7. The method of claim 1, wherein the insulating layer comprises metal oxide.

8. The method of claim 7, wherein the insulating layer comprises aluminum oxide ($Al_2O_3$).

* * * * *